United States Patent [19]

Miyamoto et al.

[11] Patent Number: 4,679,022
[45] Date of Patent: Jul. 7, 1987

[54] MAGNETIC FIELD GENERATING DEVICE FOR NMR-CT

[75] Inventors: Toshinobu Miyamoto; Hiroo Hayashi; Hideya Sakurai; Hirofumi Takabayashi; Youichi Ohnishi, all of Mishima, Japan

[73] Assignee: Sumitomo Special Metal Co. Ltd., Osaka, Japan

[21] Appl. No.: 909,327

[22] Filed: Sep. 19, 1986

[30] Foreign Application Priority Data

Dec. 27, 1985 [JP] Japan .................. 60-203549[U]
Apr. 30, 1986 [JP] Japan ...................... 61-99938

[51] Int. Cl.⁴ ................................... H01F 7/02
[52] U.S. Cl. .................. 335/296; 335/306; 324/319
[58] Field of Search .............. 335/796, 301, 304, 306; 324/318, 319, 320

[56] References Cited

U.S. PATENT DOCUMENTS 3,412,352 11/1968 Watson ............... 335/306 X
4,580,098 4/1986 Gluckstern et al. ........ 324/318 X
4,647,887 3/1987 Leupold .................. 335/306

Primary Examiner—George Harris
Attorney, Agent, or Firm—Watson, Cole, Grindle & Watson

[57] ABSTRACT

A magnetic field generating device for nuclear magnetic resonance-computerized tomography of the type wherein permanent magnet assemblies of a pair opposing mutually to define an air gap therebetween are magnetically coupled together by yoke means to create a magnetic field within the air gap is provided, which is characterized in that each permanent magnet assembly comprises a flat plate-like central permanent magnet and peripheral permanent magnets arranged around the central permanent magnet and inclined toward the inside of the air gap, the magnetic pole surface of each permanent magnet assembly forms a curved concave face with respect to the air gap, and each permanent magnet is magnetized in the direction perpendicular to the corresponding magnetic pole surface, whereby the leakage flux is reduced and the magnetic efficiency is enhanced, thus, reduction of the device dimension and weight can be achieved.

13 Claims, 13 Drawing Figures ing, and especially, a novel configuration is strongly demanded which can concentrate the magnetic flux originating from the permanent magnet effectively within the air gap to thereby permit volume reduction, miniaturization, and weight reduction of the permanent magnet.

MAGNETIC FIELD GENERATING DEVICE FOR NMR-CT

BACKGROUND OF THE INVENTION

1. Field of the Invention

This invention relates to a magnetic field generating device employing permanent magnets and used for nuclear magnetic resonance-computerized tomography (hereinafter referred to as NMR-CT) which obtains a sectional image of an object subjected to medical examination and picturizes up to the property of tissue and, particularly, to the magnetic field generating device of generating a strong, accurate, uniform magnetic field within a sufficiently large air gap space.

2. Description of the Prior Art

In order to obtain a desired tomographic image of the human body by inserting the whole body on its portion in an air gap where a strong magnetic field on the order of 1-10 kG (0.1-1 T) is created, a uniformity and stability on the order of $10^{-4}$ or less are also required for the NMR-CT usage.

Recently, as the magnetic field generating device for NMR-CT, one type of device employing permanent magnets as the magnetic field generating source has attracted attention because it causes no consumption of huge electric power and of coolant such as helium and has a configuration easy for maintenance as compared with the other types employing resistive electro magnets or superconductive magnets. Previously, the present applicant proposed one magnetic field generating device of high practicability which includes permanent magnets of superior magnetic characteristic arranged effectively therein (see U.S. Pat. Ser. No. 719,820 or E.P. No. 0161782 A1).

Specifically, as shown in FIG. 8, this proposed magnetic field generating device is characterized in that permanent magnets 1, 1 of a pair magnetized in the same direction are spaced from each other to define an air gap 4 therebetween with their different-polarity poles opposing mutually, to the opposing surface of each permanent magnet is attached a magnetic pole segment 2 having an annular projection 5 or a magnetic pole segment 2 having an annular projection 5 and a convex projection 6 formed in the central portion of the annular projection 5, and these permanent magnets are magnetically coupled together by a yoke 3, thereby creating a magnetic field within the air gap 4 (the magnetic pole segment illustrated has both the annular projection and the convex projection formed thereon).

The aforementioned magnetic field generating device has improved remarkably the uniformity of the magnetic field created within the air gap. However, this magnetic field generating device tends to cause leakage of magnetic flux from the magnetic pole segment attached to one end of each permanent magnet to the outside of the air gap and has the characteristic that on the vertical center line of the air gap, the closer to the magnetic pole surface, the stronger is the magnetic field. Therefore, to get a required high degree of uniformity of the magnetic field within the serviceable magnetic field space, it is necessary to enlarge the air gap more than a few times the serviceable magnetic field space by increasing, for example, the inter-pole distance or the area of the magnetic pole, hence, this measure limits miniaturization of the device. Accordingly, it is demanded to improve further the aforementoned magnetic field generating device to enhance its practicability, and especially, a novel configuration is strongly demanded which can concentrate the magnetic flux originating from the permanent magnet effectively within the air gap to thereby permit volume reduction, miniaturization, and weight reduction of the permanent magnet.

SUMMARY OF THE INVENTION

It is an object of the present invention to provide a magnetic field generating device for NMR-CT of the type employing permanent magnets as the magnetic field generating source, which can reduce to as little as possible the amount of magnetic flux leaking out of an air gap by a novel arrangement of permanent magnets, thereby concentrating the magnetic flux effectively in the central portion of the air gap to permit miniaturization and weight reduction.

It is another object of the present invention to provide a magnetic field generating device which can enlarge more the extent of a highly accurate, uniform, stable magnetic field created within an air gap.

To achieve the foregoing objects, the present invention provides a magnetic field generating device for NMR-CT of the type wherein permanent magnet assemblies of a pair opposing mutually to define an air gap therebetween are magnetically coupled together by yoke means to create a magnetic field within the air gap, which is characterized in that each of the permanent magnet assemblies comprises a flat plate-like central permanent magnet and a plurality of peripheral permanent magnets arranged around the central permanent magnet and inclined toward the inside of the air gap, the magnetic pole surface of each of the permanent magnet assemblies forms a curved concave face with respect to the air gap, and each of the permanent magnets is magnetized in the direction perpendicular to the corresponding magnetic pole surface.

DESCRIPTION OF THE PREFERRED EMBODIMENTS

Figure 1A:
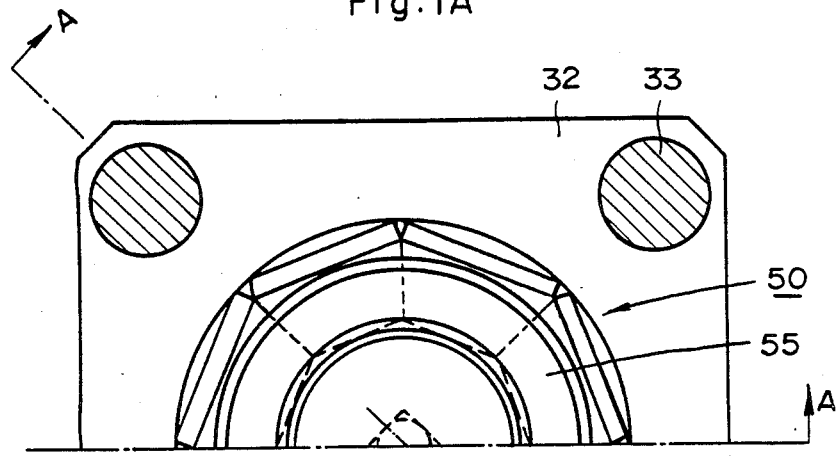
FIG. 1(A) is a transverse upper view showing an embodiment of a magnetic field generating device for NMR-CT according to the present invention.

The present device comprises central permanent magnets and peripheral permanent magnets, for which various configurations can be realized by magnetically coupling by means of a yoke assembly a pair of permanent magnet assemblies opposing mutually to define an air gap therebetween. Arrangement of these permanent magnet assemblies is desirably determined appropriately depending upon the magnetic characteristic, shape and dimension of the permanent magnet assemblies, the shape and dimension of the yoke assembly, and the required size of the air gap.

The yoke assembly forming a part of the present device can take various configurations and shapes. For example, a yoke assembly 10 shown in FIG. 2 comprises a pair of opposed plate-like yokes 11 and 11 and a plurality of rod-like yokes 12 (four yokes shown in the drawing) which couple the plate-like yokes together, and on the opposing inner surfaces of these plate-like yokes 11 and 11 are attached the permanent magnet assemblies (not shown in this drawing) according to the present invention to define a required air gap 13. This type of yoke assembly has the advantage that an object subjected to examination can be brought into the air gap 13 through between any pair of rod-like yokes 12, and is very easy for assembly, maintenance and management.

Figure 2:
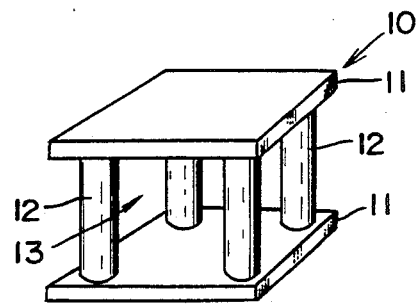
FIGS. 2 through 4 are perspective views showing embodiments of a yoke assembly forming a part of the magnetic field generating device for NMR-CT of the present invention.

Although the plate-like yokes 11 and 11 shown in FIG. 2 are square, they can take any shape such as a disk shape and may be made rectangular, for example, on the supposition that the device will be transported to and installed in a narrow place. Further, the shape, number and the like of the rod-like yokes 12 are desirably determined appropriately within a range of causing no-saturation of the flux passing therethrough.

Figure 3:
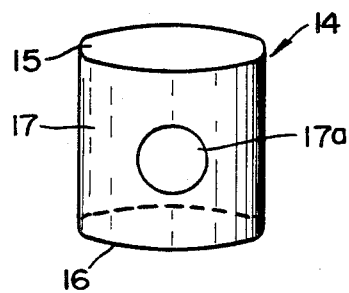

A yoke assembly 14 shown in FIG. 3 comprises opposed disk-like yokes 15 and 16 and a cylinder-like yoke 17 which connects the disk-like yokes together, and on the inner surfaces of these opposed disk-like yokes 15 and 16 are attached the permanent magnet assemblies (not shown) to define the air gap therebetween so that the air gap is enclosed by this cylinder-like yoke 17. The cylinder-like yoke 17 has an opening 17a bored therein for insertion of an object to be examined, hence, this configuration has the advantage that substantially no leakage of the magnetic field is caused by the yoke assembly 14.

Figure 4:
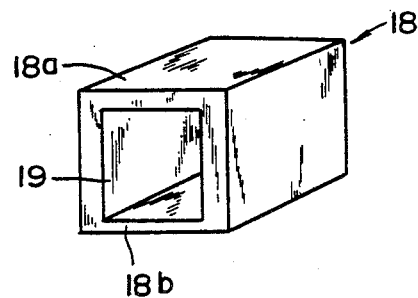

A yoke assembly 18 shown in FIG. 4 comprises a quadrangular cylinder-like yoke, the direction of its opening 19 is made horizontal, and on the inner surfaces of its upper and lower yoke portions 18a and 18b are attached the paired permanent magnet assemblies (not shown) to define the air gap therebetween.

The permanent magnet assembly comprises a flat plate-like central permanent magnet and a plurality of peripheral permanent magnets arranged around the central permanent magnet and inclined toward the inside of the air gap. If it is possible to form a magnetic pole surface by these permanent magnets so as to create a curved concave face, the central permanent magnet can take any shape, such as a disk-like shape or a polygonal plate-like shape, and the peripheral permanent magnets may be arranged along the whole periphery of the central permanent magnet or along a part thereof depending upon the shape of the central permanent magnet, the required degree of uniformity of the magnetic field within the air gap, etc.

Since each permanent magnet is generally made into a required shape by subjecting each block-shaped magnet to a magnetizing/assembling process, its shape is desirably determined taking into consideration the efficiency of assembly work. That is, the permanent magnet assembly can easily be assembled if the central permanent magnet is made into the form of a polygonal plate and if the peripheral permanent magnets are made into such a shape as to be attached to the respective peripheral sides of the central permanent magnet and arranged therearound.

Each permanent magnet forming the permanent magnet assembly may be made of ferrite magnet, Alunico magnet, or rare earth cobalt magnet. If Fe-B-R series permanent magnet (R represents one or more elements out of the light rare earth element group, inclusive of Nd and Pr, which is one of the rich resources, and B and Fe are included as the principal components) is employed, which was previously proposed by the preset applicant (see Japanese Patent Application Laid-Open No. 61-34242) and produces a very high energy product of the order of 30 MGOe or more, the permanent magnet assembly can be miniaturized remarkably.

Of course, it is not necessary to make the central permanent magnet and peripheral permanent magnets by the same material. Contrarily, individual permanent magnets may be made by different materials, such as ferrite magnet and Fe-B-R series magnet, depending upon the economical demand, required strength of the magnetic field, etc. and be arranged in combination at an appropriate order.

According to the present invention, it is not necessary to attach a magnetic pole segment to the opposing magnetic pole surface of the permanent magnet assembly which is made into the form of a curved concave face, but, the magnetic pole segment is preferably attached depending upon the shape of the permanent magnet assembly in order to moderate disturbance and the like of the magnetic field which tends to appear, for example, between the contact portions of the central permanent magnet and the peripheral permanent magnets to thereby make easy creation of a uniform magnetic field.

That is, the gap-confronted surface of the magnetic pole segment is preferably made so as to give the curved concave face in consideration of a required uniform magnetic field, and its back-side surface contacting with the permanent magnets must be made into such a shape as to harmonize with the shape, number and the like of the central permanent magnet and peripheral permanent magnets.

Figure 5A:
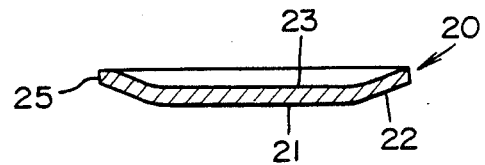
FIG. 5(A) is a sectional view taken along line B—B in FIG. 5(B)
Figure 5B:
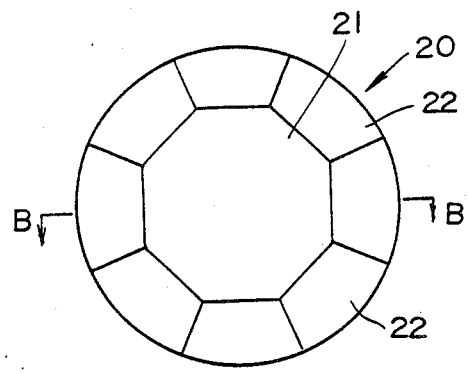
FIG. 5(B) is a bottom view showing an embodiment of a magnetic pole segment used in the magnetic field generating device for NMR-CT of the present invention.

For example, the magnetic pole segment 20 shown in FIG. 5(A) is of the form of a so-called dish which has a required curved concave face, and its contact surface with the permanent magnets is made into such a shape as shown in the bottom view of FIG. 5(B) because the permanent magnet assembly is composed of the octagonal central permanent magnet and the trapezoidal peripheral permanent magnets abutable on the respective peripheral sides of the central permanent magnet and contactable with the adjoining ones in the circumferential direction, that is, the magnetic pole segment 20 is made up of an octagonal flat portion 21 and eight trapezoidal inclined portions 22 arranged around the periphery of the flat portion 21, whereby there is surely created a definite magnetic path communicating with the permanent magnet assembly.

Figure 5C:
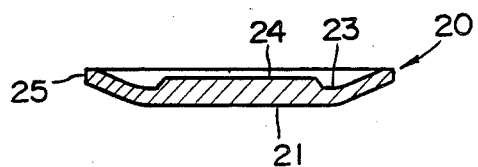
FIG. 5(C) is a sectional view similar to that of FIG. 5(A), showing another embodiment of the magnetic pole segment.

The magnetic pole segment 20 shown in FIG. 5(C) has a circular projection portion 24 formed in the central portion of a gap-confronted side flat portion 23 in order to improve further the uniformity of the magnetic field. This magnetic pole segment 20 has a peripheral portion 25 of a smaller area in comparison with the magnetic pole segment (see FIG. 8) having the annular projection attached to the magnetic field generating device previously proposed by the present applicant, thus, the leakage flux can be reduced remarkably.

Now, embodiments of the present invention will be described with reference to FIGS. 1, 6, and 7, in which the identical portions bear the same reference numerals.

Figure 1B:
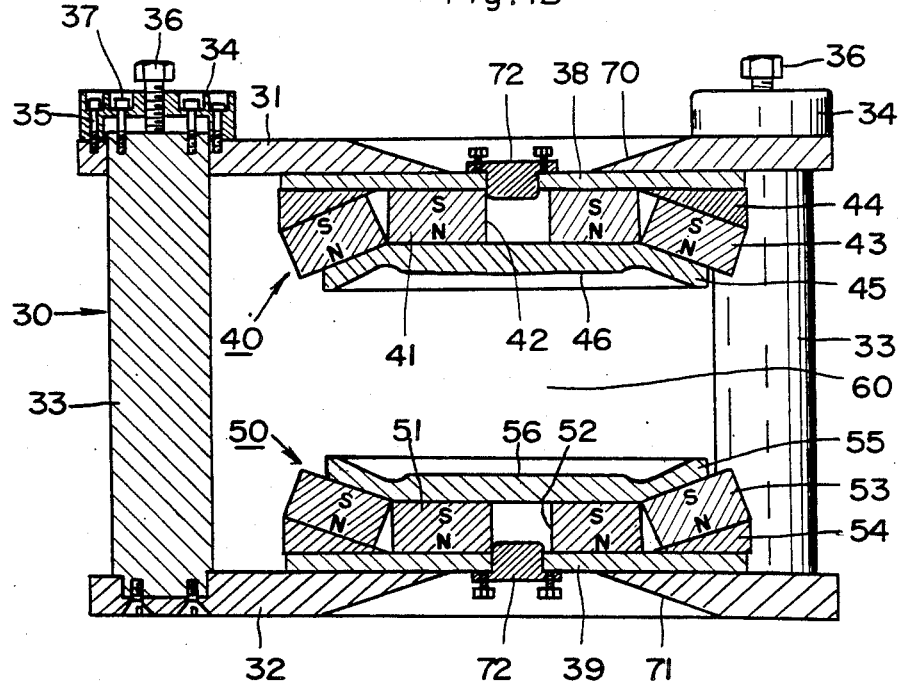
FIG. 1(B) is a sectional view taken along line A—A in FIG. 1(A)

FIG. 1(A) is a transverse upper view of a magnetic field generating device according to the present invention for use in the NMR-CT device and FIG. 1(B) is a sectional view taken along line A—A in FIG. 1(A). The device includes a yoke assembly 30 which is composed of a pair of opposed square plate-like yokes 31 and 32 coupled together by four rod-like yokes 33, on the opposing inner surfaces of the plate-like yokes 31 and 32 being attached permanent magnet assemblies 40 and 50 according to the present invention to create a required air gap 60 therebetween.

The plate-like yokes 31 and 32 and rod-like yokes 33 of the yoke assembly 30 are assembled into a single body by inserting the rod-like yokes 33 erected at the four corners of the lower plate-like yoke 32 into the holes formed at the four corners of the upper plate-like yoke 31, securing each top-provided cylindrical cover 34 to the margin of the corresponding hole of the upper plate-like yoke 31 by means of bolts 35 so as to cover the corresponding rod-like yoke 33 thus projected, and fixing each cover 34 to the corresponding rod-like yoke 33 by means of fixing bolts 37 provided around an adjusting bolt 36.

The upper plate-like yoke 31 is mounted on the upper ends of the rod-like yokes 33 via the adjusting bolts 36 each threaded at the center of the corresponding cover 34, thus is movable a little vertically in response to forward/reverse screwing of each adjusting bolt 36, so that its horizontal level or the spacing between it and the lower plate-like yoke 32 can be adjusted.

The permanent magnet assembly 40, 50 attached to the opposing surface of the upper or lower plate-like yoke 31, 32 with interposition of disk-like yoke 38, 39 having a hole in the center, is composed of a central permanent magnet 41, 51 and peripheral permanent magnets 43, 53. Each central permanent magnet 41, 51 is made into the form of an octagonal plate formed at the center with a magnetic force adjusting hole 42, 52, and the eight substantially-trapezoidal plate-like peripheral permanent magnets 43, 53 are arranged so as to contact with the respective sides of the corresponding central permanent magnet 41, 51 and inclined by means of trapezoidal wedge-like yokes 44, 54, thereby forming an opposing concave face.

That is, the permanent magnet assembly is configured so that the peripheral permanent magnets are arranged along a substantial circumference of the central permanent magnet and its magnetic pole surface forms a substantially-circular curved concave face. Although the central permanent magnet illustrated is made into the form of an octagonal plate, this magnet may be made more polygonal than the octagon so as to assume a shape very similar to a disk, but, such a shape as the illustrated one is deemed to be effective in consideration of the shape, number, assembly work and the like of the peripheral permanent magnets.

The permanent magnet assembly 40, 50 is made up of a number of block-shaped permanent magnets which are subjected to a magnetizing/assembling process so as to assume the foregoing shape, each having the magnetization direction perpendicular to the magnetic pole surface.

To each permanent magnet assembly 40, 50 having the concave magnetic pole surface formed thereon is attached a magnetic pole segment 45, 55 having a substantially-circular curved concave face, each being made up of an octagonal flat portion, eight trapezoidal inclined portions arranged around the periphery of the flat portion, and a circular projection portion 46, 56 provided on the opposing flat portion, so that there results in the function of concentrating effectively the magnetic flux within the air gap 60 formed between the paired magnetic pole segments 45 and 55.

In the central portion of the non-attached side of each plate-like yoke 31, 32 is bored a so-called tapered hole 70, 71 which communicates with the hole of the disk-like yoke 38, 39, and a magnetic force adjusting member 72 made of rod-like magnetic material to be inserted in the magnetic force adjusting hole 42, 52 of the central permanent magnet 41, 51 is attached to the margin of the hole of the disk-like yoke 38, 39 so that its extent of insertion can be adjusted.

The tapered hole 70, 71 of the plate-like yoke 31, 32 is bored, taking notice of the fact that the amount of magnetic flux becomes smaller as closing to the central portion of the plate yoke 31,32, for the purpose of reducing the weight of the yoke assembly and of preventing the magnetic force adjusting members 72 from being exposed externally.

Adjustment of the uniformity, distribution and the like of the magnetic field can be achieved by means of the adjusting bolts 36 each abutable on the upper end of the corresponding rod-like yoke 33 to adjust the spacing between the permanent magnet assemblies 40 and 50 and of the magnetic field adjusting members 72 each insertable in the central portion of the corresponding permanent magnet assembly 40, 50 to adjust the amount of shunting the flux originating from the central permanent magnet 40, 50, and further by shifting horizontally a little the disk-like yoke 38, 39, or by performing leveling of the permanent magnet assembly 40, 50 by changing the thickness and the like of the corresponding disk-like yoke, or through a combination of these measures.

Further, the disk-like yoke 38, 39 may be made integral with the wedge-like yoke 44, 54.

In the magnetic field generating device of the foregoing configuration, the magnetic flux generated by the permanent magnet assemblies 40 and 50 is converged in the same direction as the magnetization direction of the magnet by means of the magnetic pole segments 45 and 55 to create the magnetic field, thus, the amount of leakage flux is reduced and the static magnetic field having a very high degree of uniformity is obtained within the air gap 60.

According to the foregoing configuration, the permanent magnet assembly is substantially circular and the peripheral permanent magnets are arranged along the whole periphery of the central permanent magnet, thus, magnetic balance of the system is easily attained, the leakage flux is reduced, and the degree of uniformity of the static magnetic field created in the central portion of the air gap becomes so high as could not be attained by the devices hitherto known.

Figure 6A:
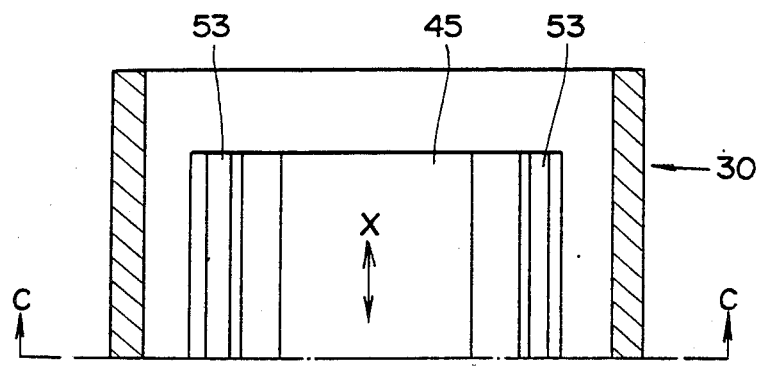
FIG. 6(A) is a transverse upper view showing another embodiment of the magnetic field generating device for NMR-CT according to the present invention.
Figure 6B:
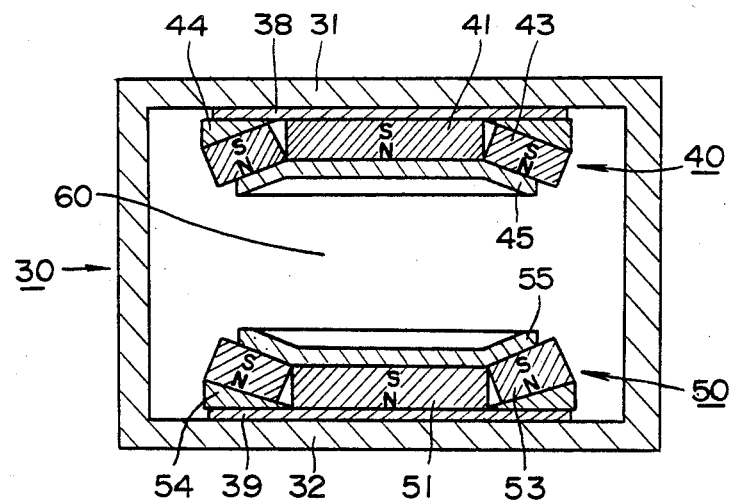
FIG. 6(B) is a sectional view taken along line C—C in FIG. 6(A)

FIG. 6(A) is a transverse upper view of another embodiment and FIG. 6(B) is a sectional view taken along line C—C in FIG. 6(B). The device illustrated has the configuration convenient in inserting an object to be examined in the direction of the arrow X and subjecting to examination, in which the yoke assembly 30 is made of a quadrangular cylinder-like yoke, and on the inner surfaces of the upper and lower plate-like yokes 31 and 32 are attached the pair of permanent magnet assemblies 40 and 50 with interposition of the rectangular plate-like yokes 38 and 39 so as to create the air gap 60.

Each permanent magnet assembly 40, 50 comprises the rectangular central permanent magnet 41, 51 and the prismatic peripheral permanent magnets 43, 53 inclined toward the inside of the air gap 60 and attached to the opposed side faces of the central permanent magnet 41, 51 extending parallelly with the insertion direction (the direction of the arrow X) of an object (not shown) to be examined, with the wedge-like yokes 44, 54 interposed between the plate-like yoke 38, 39 and the peripheral permanent magnets 43, 53, and the magnetic pole surface of each permanent magnet assembly is made so as to form a substantially groove-like curved concave face with respect to the air gap 60. As illustrated in the drawings, each permanent magnet assembly 40, 50 has the magnetization direction perpendicular to its magnetic pole surface. Further, to each magnetic pole surface is attached the plate-like magnetic pole segment 45, 55 having a substantially groove-like curved concave face.

According to the device shown in FIG. 6, similarly to the device shown in FIG. 1, the magnetic flux originating from the magnetic pole segments 45 and 55 is converged in the same direction as the magnetization direction of the permanent magnets to create the magnetic field, thus, the leakage flux is reduced and the static magnetic field having a high degree of uniformity is obtained within the air gap 60.

Especially, since the device of the foregoing configuration includes, as compared with the device shown in FIG. 1, the peripheral permanent magnets attached only to the opposed side faces of the central permanent magnet, it is rather hard to obtain magnetic balance, but, each permanent magnet can take a relatively simple shape, such as a rectangular shape or prismatic shape, thus, there is the effect that machining, assembling and the like can be performed easily. Further, since no peripheral permanent magnet is arranged at the position of insertion of an object to be examined, the spacing between the paired permanent magnet assemblies can be narrowed, thus, this configuration is advantageous also for the purpose of miniaturization and weight reduction.

Figure 7A:
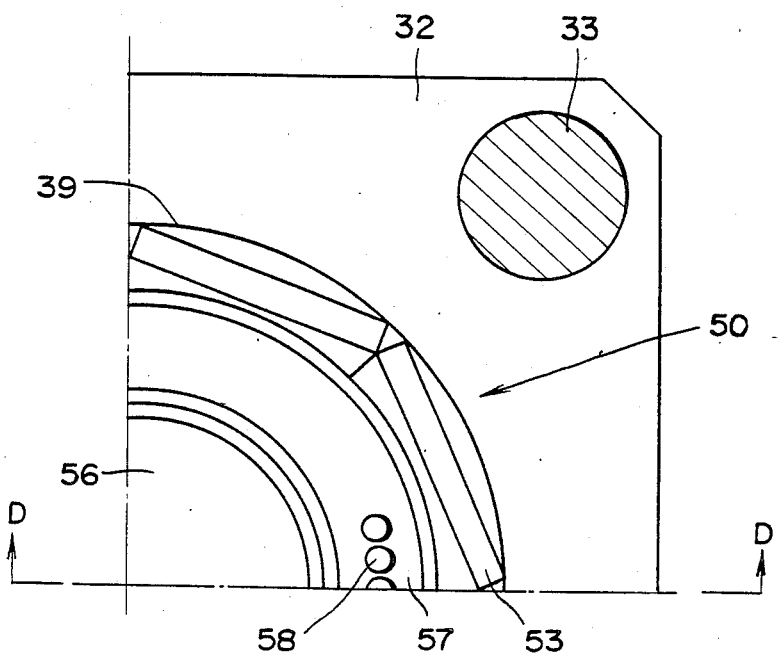
FIG. 7(A) is a fragmentary transverse upper view showing still another embodiment of the magnetic field generating device for NMR-CT according to the present invention.
Figure 7B:
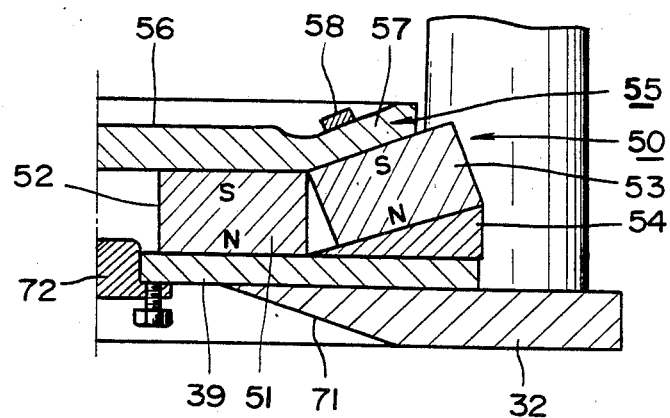
FIG. 7(B) is a sectional view taken along line D—D in FIG. 7(A)

Further, in order to overcome the case wherein a high degree of uniformity of the magnetic field could not be ensured owing to variation in magnetic characteristic of individual permanent magnets, tolerance in dimensional accuracy of individual components, etc., the present invention provides a configuration including a magnetic field adjusting segment as shown in FIG. 7 which serves as magnetic field fine adjustment means.

That is, FIG. 7 shows the configuration in which at least one magnetic field adjusting segment 58 made of magnetic material is attached to a required spot on the peripheral inclined portion 57 of the magnetic pole segment 55 having the curved concave face which in turn is attached on the magnetic pole surface of the permanent magnet assembly 50 composed of the central permanent magnet 51 and the peripheral permanent magnets 53 (the configuration illustrated includes five metallic disklike magnetic field adjusting segments attached on each side).

The shape, dimension, and number of the magnetic field adjusting segments 58 can be determined arbitrarily, and the attached spot of each magnetic field adjusting segment can be anywhere if it is within the peripheral inclined portion 57 of the magnetic pole segment 55 as shown in FIG. 7, but, the foregoing selectable conditions must be determined depending upon the magnetic characteristic of the permanent magnet, as well as the shape, dimension and the like of the permanent magnet assembly 50 and magnetic pole segment 55 so as to create the magnetic field of required uniformity. Of course, the magnetic field adjusting segment 58 may either by attached after assembly of the device or be previously formed integrally with the peripheral inclined portion 57.

As described hereinabove, according to the present invention, the permanent magnet assembly includes the effectively arranged central permanent magnet and peripheral permanent magnets and its magnetic pole surface is made into the form of a curved concave face, thus, it becomes possible to reduce remarkably the amount of the flux leaking out of the air gap, the excellently accurate, uniform, stable magnetic field can be created within the air gap, and miniaturization and weight reduction of the device can be attained.

EXAMPLE

The magnetic field generating device of the present invention shown in FIG. 1 was assembled using Fe-B-R series permanent magnet having a maximum energy product of 35 MGOe as the central permanent magnet and peripheral permanent magnets and setting the spacing between the magnetic pole segments to 570 mm. The magnetic field strength obtained in the central portion of the air gap was 1.5 kG, the uniformity of the magnetic field within the range of 300 mmDSV was less than 40 ppm, and the weight of the permanent magnet assembly was 1.1 tons.

Figure 8:
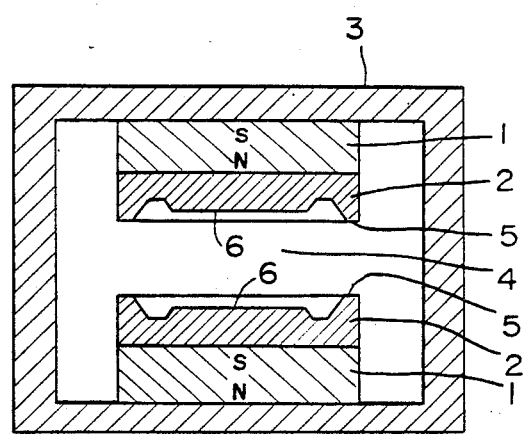
FIG. 8 is a vertical sectional view showing the conventional magnetic field generating device for NMR-CT.

The conventional device of the configuration shown in FIG. 8 was also manufactured using permanent magnets of an equivalent composition and magnetic characteristic to the above. It needed the permanent magnet of 1.5 tons to get a similar uniform magnetic field area and magnetic field strength to the foregoing example of the present invention.

Further, the amount of flux $\phi_1$ permeating the permanent magnet surface contacting with the yoke and the amount of flux $\phi_2$ concentrated in the central portion of the air gap, i.e. within the space between the central planes of the magnetic pole segments were measured and the utilization factor of flux ($\phi_1/\phi_2 \times 100\%$) was calculated. The results are as follows:

Utilization factor of the present device = 45%

Utilization factor of the conventional device = 32%.

The above proves that the magnetic field generating device of the present invention gives a smaller leakage flux and a markedly higher magnetic efficiency than the conventional device.

What is claimed is:

1. A magnetic field generating device for nuclear magnetic resonance-computerized tomography of the type wherein permanent magnet assemblies of a pair opposing mutually to define an air gap therebetween are magnetically coupled together by yoke means to create a magnetic field within said air gap, characterized in that each of said permanent magnet assemblies comprises a flat plate-like central permanent magnet and a plurality of peripheral permanent magnets arranged around said central permanent magnet and inclined toward the inside of said air gap, the magnetic pole surface of each of said permanent magnet assemblies forms a curved concave face with respect to said air gap, and each of said permanent magnets is magnetized in the direction perpendicular to the corresponding magnetic pole surface.

2. A magnetic field generating device according to claim 1, wherein said peripheral permanent magnets are arranged along a substantial circumference of the corresponding central permanent magnet, and each of said magnetic pole surfaces forms a substantially-circular curved concave face.

3. A magnetic field generating device according to claim 2, wherein a magnetic pole segment having a substantially-circular curved concave face is attached to each of said magnetic pole surfaces.

4. A magnetic field generating device according to claim 3, wherein each of said magnetic pole segments has a circular projection portion in its central portion.

5. A magnetic field generating device according to claim 3, wherein at least one magnetic field adjusting segment made of magnetic material is attached to the peripheral inclined portion of either said magnetic pole segment.

6. A magnetic field generating device according to claim 2, wherein said yoke means is composed of a pair of plate-like yokes and a plurality of rod-like yokes for coupling said plate-like yokes together.

7. A magnetic field generating device according to claim 2, wherein said yoke means is composed of a cylindrical yoke with both ends closed which has an opening bored in its peripheral wall.

8. A magnetic field generating device according to claim 2, wherein said yoke means is composed of a quadrangular cylindrical yoke whose opening direction is made horizontal.

9. A magnetic field generating device according to claim 1, wherein said peripheral permanent magnets are arranged substantially straightly and mutually parallelly with putting the corresponding central permanent magnet therebetween, and each of said magnetic pole surfaces forms a substantially groove-like curved concave face.

10. A magnetic field generating device according to claim 9, wherein a magnetic pole segment having a substantially groove-like curved concave face is attached to each of said magnetic pole surfaces.

11. A magnetic field generating device according to claim 10, wherein at least one magnetic field adjusting segment made of magnetic material is attached to the side end inclined portion of either said magnetic pole segment.

12. A magnetic field generating device according to claim 9, wherein said yoke means is composed of a pair of plate-like yokes and a plurality of rod-like yokes for coupling said plate-like yokes together.

13. A magnetic field generating device according to claim 9, wherein said yoke means is composed of a quadrangular cylindrical yoke whose opening direction is made horizontal.

* * * * *